United States Patent [19]
Whitney et al.

[11] Patent Number: 5,506,425
[45] Date of Patent: Apr. 9, 1996

[54] SEMICONDUCTOR DEVICE AND LEAD FRAME COMBINATION

[75] Inventors: David Whitney, San Jose; Lynn Wiese, Santa Clara, both of Calif.

[73] Assignee: Siemens Components, Inc., Iselin, N.J.

[21] Appl. No.: 355,452

[22] Filed: Dec. 13, 1994

Related U.S. Application Data

[63] Continuation of Ser. No. 40,829, Mar. 31, 1993, abandoned.

[51] Int. Cl.⁶ .......................... H01L 27/74; H01L 31/111
[52] U.S. Cl. .......................... 257/177; 257/178; 257/180; 257/676
[58] Field of Search .......................... 257/177, 178, 257/180, 181, 182, 666, 667, 676, 778, 109

[56] References Cited

U.S. PATENT DOCUMENTS 3,928,093  12/1975  Van Tongerloo et al. .............. 257/177

FOREIGN PATENT DOCUMENTS

| | | |
|---|---|---|
| 55-115364 | 9/1980 | Japan . |
| 58-78173 | 5/1982 | Japan .................................... 257/177 |
| 58-35953 | 3/1983 | Japan .................................... 257/181 |
| 62-79669 | 4/1987 | Japan .................................... 257/177 |
| 63-73544 | 4/1988 | Japan .................................... 257/676 |
| 63-120431 | 5/1988 | Japan . |
| 63-318761 | 12/1988 | Japan . |
| 2-7472 | 1/1990 | Japan .................................... 257/177 |
| WO10560 | 5/1993 | WIPO . |

*Primary Examiner*—Ngân V. Ngô
*Attorney, Agent, or Firm*—Joseph S. Codispoti

[57] ABSTRACT

An optically-triggered silicon controlled rectifier (SCR) device (21) mounted on a lead frame (34). The SCR device contains a cathode layer (24), an optical gate or control layer (23), and an anode layer (31) formed on a semiconductor substrate (22). The device is soldered onto a pedestal (33) formed on the lead frame. To connect the device to the lead frame, solder is deposited upon the anode layer and the solder fixes the anode layer to the pedestal on the lead frame. The pedestal may be formed by etching or stamping a depression (35) in the lead frame. The device is centered on the pedestal such that the edges of the device are located adjacent the depression, and are spaced from the lead frame.

7 Claims, 1 Drawing Sheet

SEMICONDUCTOR DEVICE AND LEAD FRAME COMBINATION

CROSS-REFERENCE TO RELATED APPLICATION

This is a continuation of Ser. No. 08/040,829 filed Mar. 31, 1993, now abandoned.

BACKGROUND OF THE INVENTION

1. Field of the Invention

The invention relates to the field of solid state electronics. More particularly, the invention relates to a method of fabricating a semiconductor device and a device so formed.

2. Description of the Prior Art

Generally, semiconductor devices are manufactured by producing various layers of semiconductor material upon a silicon substrate. To facilitate structural support of the device and provide a conductive pad to connect a conductive lead, the device is typically attached by solder to a lead frame. The lead frame attaches only to a specific, centrally located portion of the device and the remainder of the device is electrically isolated from the lead frame by an air gap. During encapsulation of the device, this air gap is typically filled with an insulating material used to encapsulate the device. In this manner, the gap prevents edges of the device from inadvertently shorting to the lead frame, mitigates electrical arcing from the device to the lead frame and reduces possible device breakdown. Typically, such an air gap provides adequate electrical isolation of the edges of the semiconductor device from the lead frame. For many devices, the voltage difference between the edges of the device and the lead frame is zero volts, thus arcing cannot occur and shorting has no effect on device performance. Moreover, for other devices, the maximum voltage difference between the device edges and the lead frame is relatively small and the typical spacing used to provide isolation between the device edges and the lead frame provides sufficient isolation. However, in many high-voltage devices, the typical spacing may not be adequate to prevent arcing between the device edges and the lead frame. Therefore, in high voltage devices, electrical isolation of the edges of a device can be problematic.

In the past, the general practice for constructing a high-voltage semiconductor device has been to use a junction isolation structure within the device to provide electrical isolation of the edges of the device from the lead frame attached to the device. Typically, isolation for a typical junction is provided by diffusing into the edges of the device, a layer of impurities. This layer of impurities contains the same concentration of impurities as a bottom layer of the device, i.e., the layer that connects to the lead frame. In this manner, a uniformly doped semiconductor layer extends along the entire bottom of the device including where the device connects to the lead frame, and along vertical sides of the device. In short, this layer is formed wherever the device is closely spaced from the lead frame. Because the lead frame connects to this bottom layer, the lead frame and the bottom layer have the same potential. As such, there is no potential difference between the device edges and the lead frame to facilitate arcing or detrimental shorts and, therefore, this junction isolation structure achieves the desired electrical isolation. Although this isolation technique provides isolation for many device designs, the technique has not proved entirely satisfactory. For instance, in many devices, there is not sufficient space on the device to provide junction isolation for the sides of the device. In other devices, the device layout does not permit a uniformly doped layer to extend along its sides and bottom. Also, the added expense of providing junction isolation to a chip is usually substantial.

Consequently, those concerned with the development of high-voltage integrated circuits and other semiconductor devices have long recognized the need for improved fabrication techniques which provide electrical isolation of the device edges from its lead frame.

SUMMARY OF THE INVENTION

To remedy the deficiencies in the art, the present invention teaches the use of a unique pedestal lead frame and a semiconductor device connected thereto.

In general, our invention is directed to a semiconductor device mounted and centered on a pedestal formed on a lead frame. The device contains a semiconductor substrate and a layer of doped impurities located in a surface of the substrate. An ohmic contact is fixed to the layer of doped impurities and mounts the device on the pedestal. Edges of the device extend over the sides of the pedestal such that the space between the device edges and the lead frame provide electrical isolation.

Additionally, the invention is directed to a method of fabricating a semiconductor device. Using our inventive method, impurities are diffused into a surface of a semiconductor substrate to form a doped layer. A depression, typically, having a circular shape, is formed on the surface of a lead frame to create a pedestal having a mounting surface which is smaller than a width of a semiconductor device to be mounted thereupon. An ohmic contact is deposited on the doped layer of the semiconductor device. The device is mounted on the lead frame with the ohmic contact fixed on the pedestal such that the edges of the device are located over the depression such that the space formed by the depression between the device edges and the lead frame provide electrical isolation.

More specifically, using our inventive fabrication technique, a silicon controlled rectifier (SCR) device is mounted on a pedestal of a lead frame. The pedestal is created by forming a depression in the mounting surface of the lead frame. The depression typically has a circular shape. However, any shape that permits the device edges to extend thereover is appropriate. The SCR device has a number of layers of semiconductor material diffused into an N type substrate. To form the SCR, a first P+ layer is diffused into an upper surface of the substrate. An N+ layer is diffused into an upper surface of the first P+ layer. A cathode contact (metallic layer) is deposited on the N+ layer. A second P+ layer is diffused into a lower surface of the substrate. An anode contact is deposited on the second P+ layer. The device is mounted on the lead frame with the anode contact fixed on the pedestal such that edges of the device extend over the sides of the pedestal. In this manner, the depression creates an electrical isolation space between the device edges and the lead frame. Formation of the pedestal may be accomplished by etching or stamping the depression in the surface of the lead frame. Though, typically, the pedestal is formed from a circular depression, any closed shape depression, rectangle, square and the like can also be used. In general, the shape of the depression matches the shape of the device connected to the lead frame.

BRIEF DESCRIPTION OF THE DRAWING

The teachings of the present invention can be readily understood by considering the following detailed descrip

DETAILED DESCRIPTION OF THE PREFERRED EMBODIMENT

Figure 1:
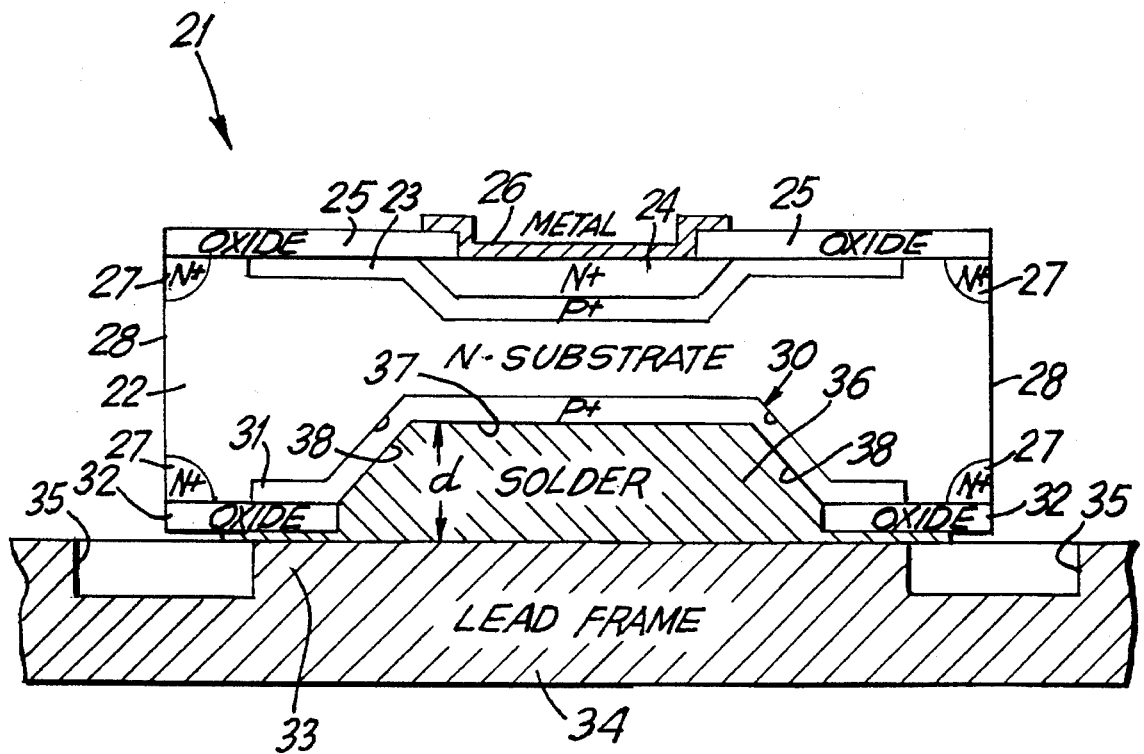
- FIG. 1 is a cross-sectional view of a portion of a semiconductor device fabricated in accordance with the present invention.

Although the preferred embodiment will be described in the context of a typical high-voltage semiconductor device, e.g., an optically-triggered silicon controlled rectifier (SCR), it will be evident to those skilled in these arts that our invention has broad application with respect to structures and fabrication methods for producing other semiconductor devices where low-cost, effective electrical isolation is desired.

In general, an SCR is a four-layer P-N-P-N unidirectional device which is primarily used for bistable switching of high voltages. A typical SCR has three semiconductor junctions, formed from layers of semiconductor material, and three terminals: anode, cathode and gate each of which conductively connects to a corresponding layer of the device. Gate current is one factor that determines the anode-to-cathode voltage, i.e., the so-called "breakover" voltage, at which the device begins to conduct current from cathode-to-anode. In an optically-triggered SCR, the control element or gate is an optically sensitive layer located between the anode and cathode. Illuminating optical radiation produces a photocurrent in the optically sensitive layer. The amount of photo-current determines the anode-to-cathode voltage at which the device begins to conduct. The anode-to-anode voltage during conduction is known as the forward voltage. During full conduction, the forward voltage of the SCR is a function of the spacing between the anode and cathode layers.

FIG. 1 shows a portion of optically-triggered, vertical SCR 21 mounted on lead frame 34. Specifically, SCR 21 is formed on N type substrate 22 by diffusing P type impurities into an upper region of the substrate to form a P+ control layer 23. The control layer is comparatively thicker in a central portion than towards the edges or outer portion of the layer. N+ cathode layer 24 is formed by diffusing N type impurities into the central portion of layer 23. Oxide layer 25 is formed on the outer portion of layer 23 and partly covers the edge of layer 24 leaving an opening in which a metal layer is deposited to act as cathode terminal 26. Oxide layer 25 is permeable to optical radiation such that P+ control layer 23 can be illuminated with an incident light beam. The light beam is a conventional optical control beam which, if of sufficient intensity, triggers SCR 21.

A vertical trench 30 is etched into the bottom surface of substrate 22. The trench has bottom 37 and sides 38 which form a surface and define a depth (symbolized by distance "d"). P type impurities are diffused into substrate 22 in the surface of trench 30 to form P+ anode layer 31. By accurately controlling the depth of the trench, the spacing between layers 31 and 23 is accurately controlled. Oxide layer 32 is formed on the bottom surface of substrate 22 and along a circumferential edge of P+ layer 31. Four N+ regions, located along device edges 28, form conventional channel stops 27 which prevent surface leakage during reverse bias of the SCR.

SCR 21 is mounted on raised pedestal 33 formed in lead frame 34. The lead frame provides structural support for the semiconductor device and a contact area for connection of a conductive lead (not shown). Pedestal 33, which may be created by etching, stamping or otherwise forming depression 35 in the upper surface of frame 34, electrically isolates lead frame 34 from the circumferential edges 28 of the silicon substrate which forms the SCR.

SCR 21 is preferably mounted on pedestal 33 by a soldering process. This process produces an ohmic contact between the exposed portion of P+ layer 31 and lead frame 34. This contact provides anode terminal 36.

In a typical SCR application, an applied voltage is connected between cathode terminal 26 and anode terminal 36. When optical radiation of a sufficient intensity passes through layer 25 to illuminate P+ control layer 23, a photocurrent is generated in layer 23. The amount of photocurrent produced will primarily determine the breakover voltage of SCR 21, i.e., the value of the applied voltage at which SCR 21 begins to conduct. When the SCR is triggered by an external light pulse and the applied voltage forms a forward bias that is greater than the breakover voltage, the SCR conducts current vertically between cathode terminal 26 and anode terminal 36. SCR 21 will continue to conduct until the applied voltage forming the forward bias is removed or falls below a level known as a forward voltage. SCR 21 will not conduct again until there is an applied voltage in the forward direction which exceeds the breakover level and control layer 23 is triggered by a light pulse. During those periods of non-conduction, i.e., when SCR 21 is either reverse biased or not triggered, there may be a significant high-voltage difference between device edges 28 and lead frame 34. Such high-voltage can cause arcing between the device edges and the lead frame. Additionally, high electric fields produced between the device and the lead frame may cause device breakdown. It is for this reason that electrical isolation of these portions of the device is necessary.

As discussed above, traditional junction isolation of edges 28 would require that SCR 21 be modified to extend anode layer 31 along the entire bottom and sides of the device to cover edges 28. However, this isolation technique is not always possible or desirable for a number of reasons. First, the vertical nature of SCR 21 would be changed since anode layer 31 would now extend along edges 28 towards the cathode layer of SCR 21. Second, junction isolation would require deep diffusion of the anode layer along sides 28 necessitating additional manufacturing expense. Additionally, the thickness of the wafer may have to be reduced to enable adequate diffusion depth of the junction isolation layer. Also, to maintain the present operating characteristics of the SCR, extending the anode layer to form a junction isolation layer within a device like SCR 21 would normally require that the device be made wider such that the junction isolation layer will not affect the passage of electrons through the device. Increasing the device width may be unacceptable because, for example, there may not be sufficient space on the substrate for the additional width. However, when using the principles of the present invention, a significant level of isolation is achieved without adversely affecting SCR performance. By mounting SCR 21 on pedestal 33, the space in depression 35 provides significant isolation of edges 28 from frame 34. Additionally, when edges 28 are passivated with an insulating material (not shown) during conventional device encapsulation, a relatively high isolation voltage is achieved between device edges 28 and lead frame 34.

Given the foregoing description of our invention, those skilled in the art would readily be able to determine appropriate dimensions of the trench, pedestal and various layers to produce an operational semiconductor device. Obviously many modifications and variations of the present invention are possible in the light of the above teachings.

What is claimed is:

1. A semiconductor device (21) comprising:
   a lead frame (34) having a raised pedestal (33);
   a semiconductor substrate (22) having a first surface and opposed side edges;
   a layer (31) of doped impurities located in said first surface; and
   an ohmic contact (36) fixed to said layer of doped impurities and mounted on said pedestal such that the ohmic contact and the first surface of the substrate form a substantially planar surface from one opposed side edge to the other, said edges extending beyond said pedestal such that said edges are spaced from said lead frame to provide electrical isolation.

2. The device of claim 1 wherein a depression (35) in a surface of said lead frame forms said pedestal.

3. The device of claim 2 wherein said edges are located adjacent said depression.

4. The semiconductor chip of claim 3 wherein said layer and said substrate are oppositely doped.

5. A silicon controlled rectifier (SCR) device (21) comprising:
   a semiconductor substrate (22) having an upper surface, a lower surface and opposed side edges;
   a control layer (23) located in the upper surface of said substrate;
   a cathode layer (24) located in an upper surface of said control layer;
   a cathode contact (26) fixed to said cathode layer;
   an anode layer (31) located in the lower surface of said substrate;
   an anode contact (36) deposited on said anode layer; and
   a lead frame (34) having a raised pedestal (33), said anode contact fixed on said pedestal such that the anode contact and the lower surface of the substrate form a substantially planar surface from one opposed side edge to the other and said side edges extending beyond said pedestal and spaced from said lead frame.

6. The device of claim 5 wherein said pedestal includes a raised portion formed by a depression (35) located in the surface of said lead frame.

7. The device of claim 6 wherein said side edges are located adjacent said depression.

* * * * *